(12) United States Patent
Yao et al.

(10) Patent No.: US 8,472,142 B2
(45) Date of Patent: Jun. 25, 2013

(54) METHOD OF MAKING A BONDED STRUCTURE FOR AN ELECTRICAL COMPONENT, AND/OR HEAD GIMBAL ASSEMBLY, HEAD STACK ASSEMBLY, AND DISK DRIVE UNIT INCORPORATING THE SAME

(75) Inventors: MingGao Yao, Dong Guan (CN); YiRu Xie, Dong Guan (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 1309 days.

(21) Appl. No.: 11/902,253

(22) Filed: Sep. 20, 2007

(65) Prior Publication Data

US 2009/0080111 A1 Mar. 26, 2009

(51) Int. Cl.
*G11B 5/60* (2006.01)

(52) U.S. Cl.
USPC .................................................. 360/234.5

(58) Field of Classification Search
USPC .......................................... 360/234.5
See application file for complete search history.

(56) References Cited

U.S. PATENT DOCUMENTS

| 7,130,159 B2 * | 10/2006 | Shimizu et al. ............ 360/294.4 |
| 7,298,593 B2 * | 11/2007 | Yao et al. ................... 360/294.4 |
| 7,408,745 B2 * | 8/2008 | Yao et al. ................... 360/294.4 |

FOREIGN PATENT DOCUMENTS

JP 2005-175274 6/2005

* cited by examiner

*Primary Examiner* — David D Davis
(74) *Attorney, Agent, or Firm* — Nixon & Vanderhye PC

(57) ABSTRACT

The present bonded structure uses metal ball to bond or weld the respective bonding surfaces of electrical pads which are arranged to face the same direction. The structure can be controlled visually and thus enables a high connection quality of no short circuit. In addition, the bonding operation of the bonded structure is carried out without using pressure, thus it will not damage surroundings of the electrical components. Accordingly, the manufacture yield is significantly improved and the cost is prominently reduced. The present invention also discloses a bonding method and a head gimbal assembly and a head stack assembly and a drive unit using the bonded structure.

18 Claims, 16 Drawing Sheets

```
┌─────────────────────────────────────────────────┐
│ step etching the substrate layer and the polymer layer of one of │
│ the electrical components along an edge thereof, providing a    │  S1
│ first electrical pad with a first attaching surface and a first │
│ bonding surface opposite the first attaching surface, disposing │
│ the first electrical pad on the electrical component with the first │
│ attaching surface attached to the polymer layer and the first   │
│ electrical pad extended beyond the edge of the polymer layer    │
│ and the substrate layer to form an extended portion             │
└─────────────────────────────────────────────────┘
                         │
                         ▼
┌─────────────────────────────────────────────────┐
│ step etching the substrate layer and the polymer layer of the   │
│ other electrical component along an edge thereof, providing a   │  S2
│ second electrical pad with a second attaching surface and a     │
│ second bonding surface opposite the second attaching surface,   │
│ disposing the second electrical pad on the other electrical     │
│ component with the second attaching surface attached to the     │
│ polymer layer and the second electrical pad extended beyond     │
│ the edge of the polymer layer and the substrate layer to form an │
│ extended portion                                                │
└─────────────────────────────────────────────────┘
                         │
                         ▼
┌─────────────────────────────────────────────────┐
│                                                                 │  S3
│ making the first and the second bonding surfaces of the first and │
│     the second electrical pads face the same direction          │
│                                                                 │
└─────────────────────────────────────────────────┘
                         │
                         ▼
┌─────────────────────────────────────────────────┐
│                                                                 │  S4
│ disposing solder on the extended portions of the first and the  │
│ second bonding surfaces and forming a soldering junction to     │
│        bond the first and the second electrical pads            │
└─────────────────────────────────────────────────┘
```

FIG. 11

METHOD OF MAKING A BONDED STRUCTURE FOR AN ELECTRICAL COMPONENT, AND/OR HEAD GIMBAL ASSEMBLY, HEAD STACK ASSEMBLY, AND DISK DRIVE UNIT INCORPORATING THE SAME

FIELD OF THE INVENTION

The present invention relates to a bonded structure and a bonding method for electrical components. More particularly, the present invention relates to bonded structures between components of a disk drive unit. Specifically, the present invention pertains to a head gimbal assembly (HGA), a head stack assembly (HSA), and a disk drive unit using the bonded structures respectively.

BACKGROUND OF THE INVENTION

Electrical connection are widely used in components such as printed electrical circuits, electronic conductors and contacts or other electrical devices for delivering data signals. The electrical connection between components is typically achieved using techniques such as flexible wires with connectors attached to the ends thereof or flexible printed circuits equipped with special connectors such as copper bumps to electrically couple with other external devices. Specifically, disk drive unit also employs electrical connection structures to achieve information storing or reproducing function.

In related art, referring to FIG. 1, a typical disk drive unit comprises a head stack assembly with sliders thereon, a printed circuit board assembly for controlling the operation of the head stack assembly, a stack of disks 110 for suspending respective sliders and a spindle motor 120 for spinning the disks 110. A voice coil motor (VCM) 140 is connected to the head stack assembly for controlling the motion of the head stack assembly and, in turn, controlling the respective sliders to position with reference to data tracks across the surface of the corresponding disks.

Common head stack assembly comprises a plurality of head gimbal assemblies. Such head gimbal assemblies possess the same structures and configurations. As for illustration, also referring to FIG. 1, a head gimbal assembly 150 with a slider 151 is connected to a drive arm 130 which is controlled by the voice coil motor 140. As is shown in FIG. 2, the head gimbal assembly 150 includes a suspension 152 having a base plate 153, a load beam 156, a hinge 154 and a flexure 155. The load beam 156 is connected to the base plate 153 by the hinge 154. The flexure 155 is made of flexible material and runs from the hinge 154 to the load beam 156. One end of the load beam 156 is mounted to the drive arm 130 (referring to FIG. 1) by means of the base plate 153, and the other end of the load beam 156 is attached to the flexure 155. The load beam 156 biases the slider 151 toward the surface of the disk 110, while the flexure 155 provides flexibility for the slider 151.

The slider 151 is electrically coupled with a printed circuit board assembly (PCBA) of the control system via a wire member or flexible printed circuit 165. Specifically, the flexure 155 forms a plurality of bonding pads 158 thereon and the flexible printed circuit 165 provides copper bumps 168 corresponding to the respective bonding pads 158 of the flexure 155. The slider 151 is electrically connected with one end of the bonding pad 158 of the flexure 155 via a plurality of traces 157. The other end of the bonding pad 158 is solder-bonded with the corresponding copper bump 168 of the flexible printed circuit 165. As the bonding pad 158 of the flexure 155 is established electrical connection with the flexible printed circuit 165, the slider 151 can selectively read from or write to the disk 110 (referring to FIG. 1) according to the signal conducting from printed circuit board assembly under the control system.

Referring to FIG. 3, as in the prior art, each bonding pad 158 of the flexure 155 (shown in FIG. 2) possesses a layered structure. That is, each bonding pad 158 is formed by sequentially depositing a Cu film 158a, an Ni film 158b and an Au film on a base film 158c of the flexure. The Ni film 158b can prevent oxidation of the Cu film 158a and the Au film on the surface of the Ni film 158b can improve the wettability of the bonding pad 158. Each copper bump 168 of the flexible printed circuit 165 is covered by a solder layer around the whole surface thereof.

When soldering, each copper bump 168 of the flexible printed circuit 165 is aligned with and pressed to the corresponding bonding pad 158 of the flexure 155 with sufficient force to keep a correct alignment and ensure an intimate contact therebetween. Then heat the flexible printed circuit 165 and the flexible 155 which are placed to be sandwiched between a heater and a holding plate for heating beforehand. Thus the solder layer of the copper bump 168 is melted and a solder junction portion 100' bonding the bonding pad 158 of the flexure 155 and the copper bump 168 of the flexible printed circuit 165 is thus formed.

In the prior method, pressure and heat play a vital roll in the electrical connection quality in the solder-bonding. If both the pressure and the heat imposed to the copper bumps 168 and the bonding pads 158 are just sufficient, two adjacent copper bumps 168a, 168b of the flexible printed circuit 165 (shown in FIG. 2) could be respectively well solder-bonded with corresponding adjacent bonding pads of the flexure. Accordingly, a space could exist between the two copper bumps, which ensures a sound electrical circuit and further enables a good read/write performance of the slider. However, if either of the pressure and the heat is excessive when doing solder-bonding, referring to FIG. 4, the solder layer of copper bumps 168a, 168b would boil, thus solder material covered the respective copper bumps 168a, 168b may spread out. Because of space limitation, the corresponding bonding pads 158, 158' may locate very close and thus the spread solder material may cause the copper bump 168a to short with the adjacent bump 168b. Therefore, the electrical function of the head gimbal assembly 150 is greatly and seriously affected. Moreover, the solder-bonding needs pressure to ensure a high-quality electrical connection, but the pressure might damage the surrounding components of both the flexure 155 and the flexible printed circuit 165.

In addition, the prior solder-bonding is operated between opposite surfaces of the flexible printed circuit 165 and the flexure 155, therefore the operation is really difficult to control the spread solders which might induce occurrence of short-circuit and adversely affects the realization of electrical connection function. In all, the prior solder-bonding increases the complexity and difficulty of manufacturing process, and thus the manufacture yield is unsatisfactorily low and the cost is inappropriately high.

Hence, a need has arisen for providing a novel bonded structure of electrical components and a bonding method thereof, and a head gimbal assembly and a head stack assembly and a disk drive unit to solve the above-mentioned problems and achieve a good performance.

SUMMARY OF THE INVENTION

Accordingly, one aspect of the present invention is to provide a bonded structure for electrical components which possesses a high-quality structure that not only avoids short circuit but also enables a high manufacture yield and a low producing cost.

Another aspect of the present invention is to provide a bonding method for electrical components with novel and simple process without using pressure. The bonding method is easy to control the bonding operation visually and is a high-quality bonding method which prevents the occurrence of short-circuit and protects the bonding electrical components from pressure damage, and, in turn, enables to realize a high manufacture yield and a low producing cost.

Yet another aspect of the present invention is to provide a head gimbal assembly with high-bonding quality which prevents the occurrence of short-circuit and enables a high manufacture yield and a low producing cost.

Still another aspect of the present invention is to provide a head stack assembly which possesses a high-quality structure that not only avoids short circuit but also enables a high manufacture yield and a low producing cost.

Another aspect of the present invention is to provide a disk drive unit with high-bonding quality that not only avoids short circuit but also enables a high manufacture yield and a low producing cost.

To achieve above objects, a bonded structure for electrical components comprises a first electrical pad disposed on one of the electrical components, a second electrical pad disposed on the other electrical component, and metal ball for bonding or welding the first and the second electrical pads. The first and the second electrical pads each have an attaching surface attached to the corresponding electrical component and a bonding surface opposite the attaching surface. Both the bonding surfaces of the first and the second electrical pads face the same direction, and the metal ball is disposed on both the bonding surfaces to form a metal junction and thereby bond the first and the second electrical pads.

As an embodiment of the invention, the electrical components respectively have a first substrate layer and a second substrate layer laminated on the first substrate layer. The first and the second electrical pads are disposed on the second substrate layers of the respective electrical components and each have an extended portion extending beyond an edge of the second substrate layer and the first substrate layer. The metal ball is disposed on the extended portions of the first and the second electrical pads.

As an embodiment of the present invention, the extended portions of the first and the second electrical pads are on the same level and aligned with each other.

As another embodiment of the present invention, the extended portion of the second electrical pad is laminated on the extended portion of the first electrical pad.

Alternatively, the extended portion of the second electrical pad has a width narrower than the extended portion of the first electrical pad to enable the metal ball to contact the first electrical pad.

Alternatively, the extended portion of the second electrical pad has a portion hollowed out to enable the metal ball to contact the first electrical pad.

Preferably, the metal ball is solder ball or gold ball.

A bonding method for electrical components comprises the steps of: (1) disposing a first electrical pad on one of the electrical components, the first electrical pad having a first attaching surface attached to the electrical component and a first bonding surface opposite the first attaching surface; (2) disposing a second electrical pad on the other electrical component, the second electrical pad having a second attaching surface attached to the other electrical component and a second bonding surface opposite the second attaching surface; (3) making the first and the second bonding surfaces of the first and the second electrical pads face the same direction; (4) disposing a metal ball on the first and the second bonding surfaces and forming a metal junction to bond the first and the second electrical pads.

As an embodiment of the invention, the electrical components respectively have a first substrate layer and a second substrate layer laminated on the first substrate layer. The step (1) further comprises a step of step etching the first substrate layer and the second substrate layer of the electrical component along an edge thereof so that the first electrical pad extends beyond the edge of the second substrate layer and the first substrate layer to form an extended portion. Accordingly, the step (2) further comprises a step of step etching the first substrate layer and the second substrate layer of the other electrical component along an edge thereof so that the second electrical pad extends beyond the edge of the second substrate layer and the first substrate layer to form an extended portion. In step (4) the metal ball is disposed on the extended portions.

As an embodiment of the present invention, the step (3) further comprises a step of placing the first and the second electrical pads on the same level and aligning the first electrical pad with the second electrical pad.

As another embodiment of the present invention, the extended portion of the second electrical pad has a width narrower than the extended portion of the first electrical pad, and the step (3) further comprises a step of laminating the extended portion of the second electrical pad on the extended portion of the first electrical pad.

As still another embodiment of the present invention, the extended portion of the second electrical pad has a portion hollowed out, and the step (3) further comprises a step of laminating the extended portion of the second electrical pad on the extended portion of the first electrical pad.

Preferably, forming a metal junction in step (4) is carried out in such a way as metal welding such as ultrasonic welding.

A head gimbal assembly comprises a micro-actuator, a suspension to load the micro-actuator, and metal ball. The micro-actuator forms at least one micro-actuator pad having a first attaching surface attached to the micro-actuator and a first bonding surface opposite the first attaching surface. The suspension forms at least one suspension pad having a second attaching surface attached to the suspension and a second bonding surface opposite the second attaching surface. The metal ball is for bonding or welding the micro-actuator pad and the corresponding suspension pad. The micro-actuator and the suspension are arranged that the first and the second bonding surfaces face the same direction. The metal ball is disposed on the first and the second bonding surfaces to form a metal junction and thereby bond the micro-actuator pad and the suspension pad.

As an embodiment of the invention, the micro-actuator and the suspension respectively have a first substrate layer and a second substrate layer laminated on the first substrate layer. The micro-actuator pad is disposed on the second substrate layer of the micro-actuator and the suspension pad is disposed on the second substrate layers of the suspension. The micro-actuator pad and the suspension pad each have an extended portion extending beyond an edge of corresponding second substrate layer and first substrate layer. The metal ball is disposed on the extending portions of the respective micro-actuator pad and the suspension pad.

A head stack assembly comprises a head gimbal assembly, a flexible circuit for controlling the head gimbal assembly, and metal ball. The head gimbal assembly has at least one first terminal pad having a first attaching surface attached to the head gimbal assembly and a first bonding surface opposite the first attaching surface. The flexible printed circuit has at least one second terminal pad having a second attaching surface attached to the flexible printed circuit and a second bonding surface opposite the second attaching surface. The metal ball is for bonding or welding the first terminal pad and the second terminal pad. The head gimbal assembly and the flexible printed circuit are arranged that the first and the second bonding surfaces face the same direction. The metal ball is disposed on the first and the second bonding surfaces to form a metal junction and thereby bond the first terminal pad and the second terminal pad.

As an embodiment of the invention, the head gimbal assembly and the flexible printed circuit respectively have a first substrate layer and a second substrate layer laminated on the first substrate layer. The first terminal pad is disposed on the second substrate layer of the head gimbal assembly and the second terminal pad is disposed on the second substrate layer of the flexible printed circuit. The first terminal pad and the second terminal pad each have an extended portion extending beyond an edge of corresponding first substrate layer and second substrate layer. The metal ball is disposed on the extended portions of the first terminal pad and the second terminal pad.

A disk drive unit comprises a head gimbal assembly, a drive arm to connect the head gimbal assembly, a disk, a spindle motor to spin the disk, a flexible printed circuit for controlling the head gimbal assembly, and metal ball. The head gimbal assembly has at least one first terminal pad. The flexible printed circuit has at least one second terminal pad. The metal ball is for bonding or welding the first terminal pad and the second terminal pad. The first terminal pad has a first attaching surface attached to the head gimbal assembly and a first bonding surface opposite the first attaching surface. The second terminal pad has a second attaching surface attached to the flexible printed circuit and a second bonding surface opposite the second attaching surface. The head gimbal assembly and the flexible printed circuit are arranged that the first and the second bonding surfaces face the same direction, and the metal ball is disposed on the first and the second bonding surfaces to form a metal junction and thereby bond the first terminal pad and the second terminal pad.

In comparison with the prior art, the present invention employs metal ball to bond or weld the respective bonding surfaces of electrical pads which face the same direction, therefore it is easy to visually control the metal junction of the electrical pads and accordingly enables a high connection quality of no short circuit. In addition, as the bonding or welding operation is carried out without using pressure, thus it will not damage surroundings of the electrical components. Moreover, because of the simple design and easy process, the manufacture yield is significantly improved and the cost is prominently reduced.

Other aspects, features, and advantages of this invention will become apparent from the following detailed description when taken in conjunction with the accompanying drawings, which are a part of this disclosure and which illustrate by way of example, principles of this invention.

BRIEF DESCRIPTION OF THE DRAWINGS

The accompanying drawings facilitate an understanding of the various embodiments of this invention. In such drawings:

FIG. 11 is a flow chart illustrating a bonding method according to the present invention;

DETAILED DESCRIPTION OF ILLUSTRATED EMBODIMENTS

Figure 1:
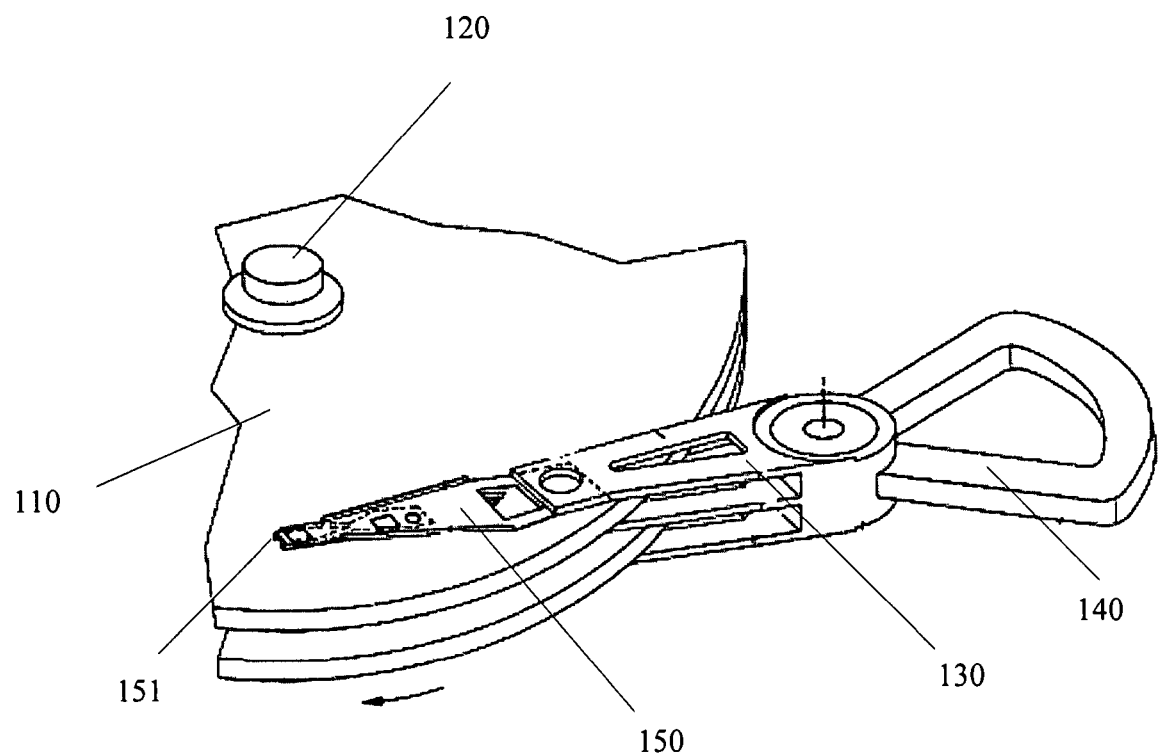
FIG. 1 is a perspective view of a conventional disk drive unit.
Figure 2:
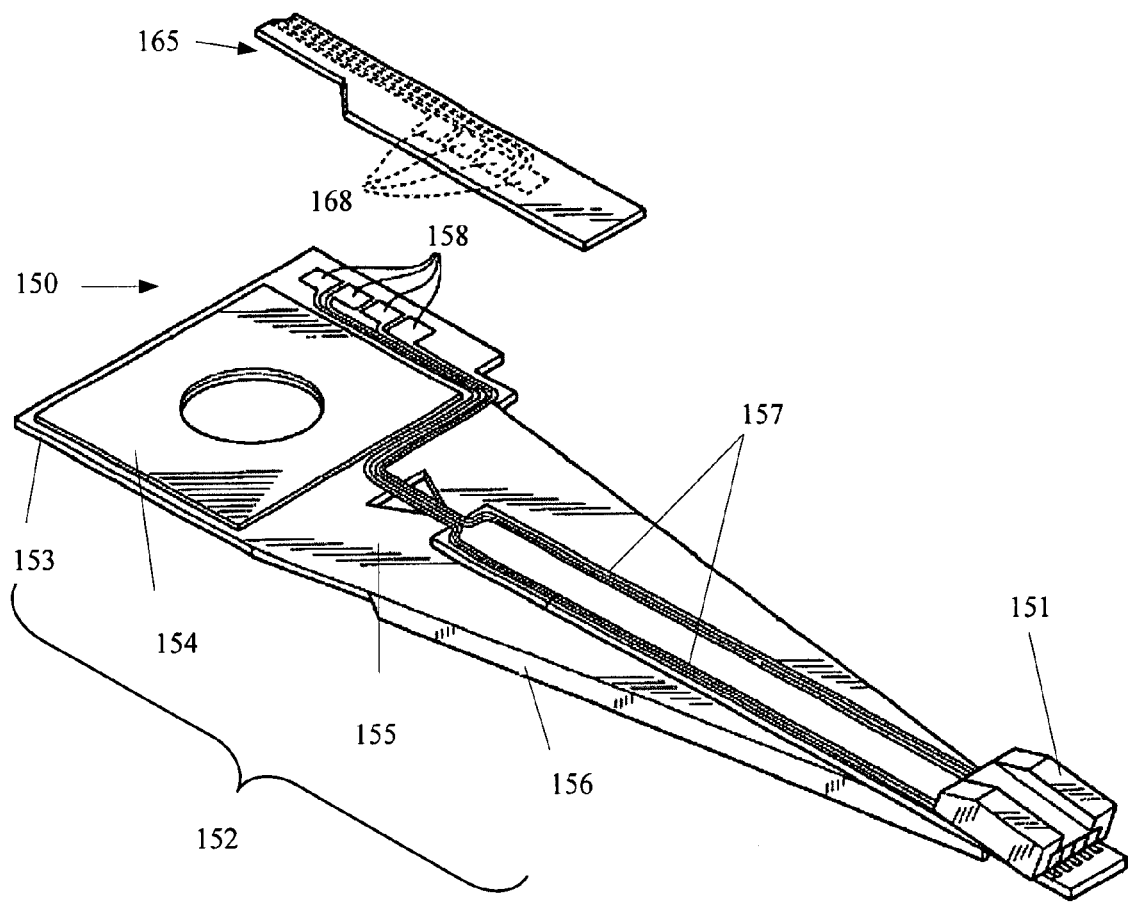
FIG. 2 is a bonded structure of a flexible printed circuit relative to a flexure of a head gimbal assembly in prior art.
Figure 3:
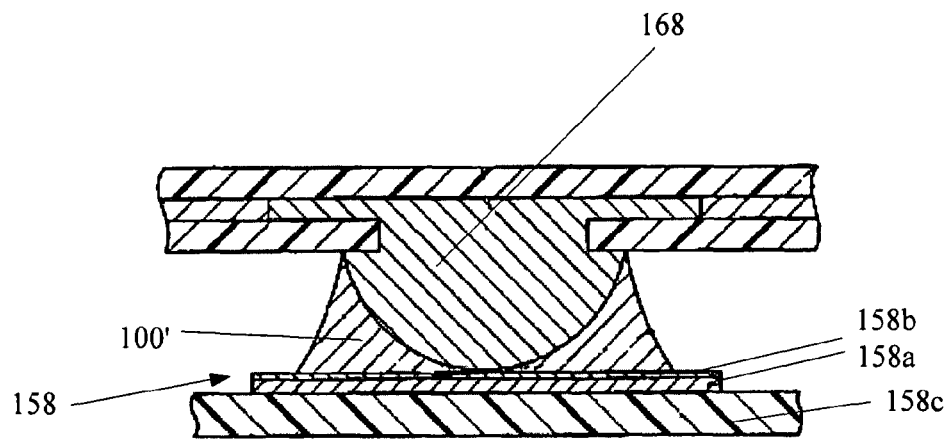
FIG. 3 is a cross-sectional view of the bonded structure of the flexible printed circuit and the flexure shown in FIG. 2.
Figure 4:
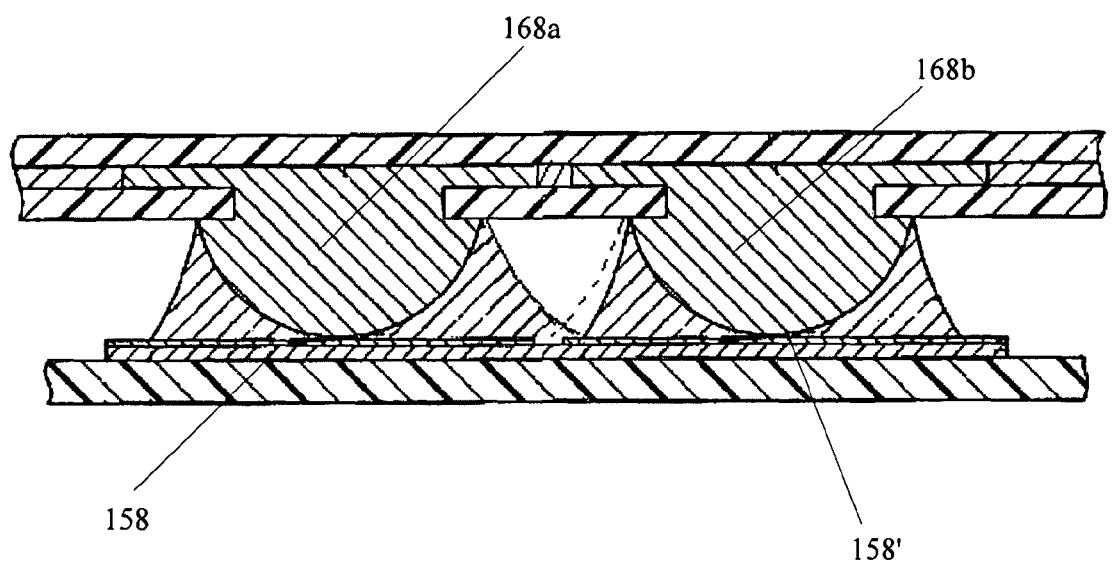
FIG. 4 illustratively shows an electrical short problem which exists in the bonded structure of FIG. 3.

Various preferred embodiments of the invention will now be described with reference to the figures, wherein like reference numerals designate similar parts throughout the various views. The present invention uses metal ball to connect the respective bonding surfaces of electrical pads which face the same direction without using pressure, therefore the connection process prevents damages to the electrical pads and provides a high-quality metal junction of no short circuit, and the whole bonded structure is simple and easy to manufacture. Accordingly the manufacture yield is significantly improved and the producing cost is prominently reduced.

Figure 5A:
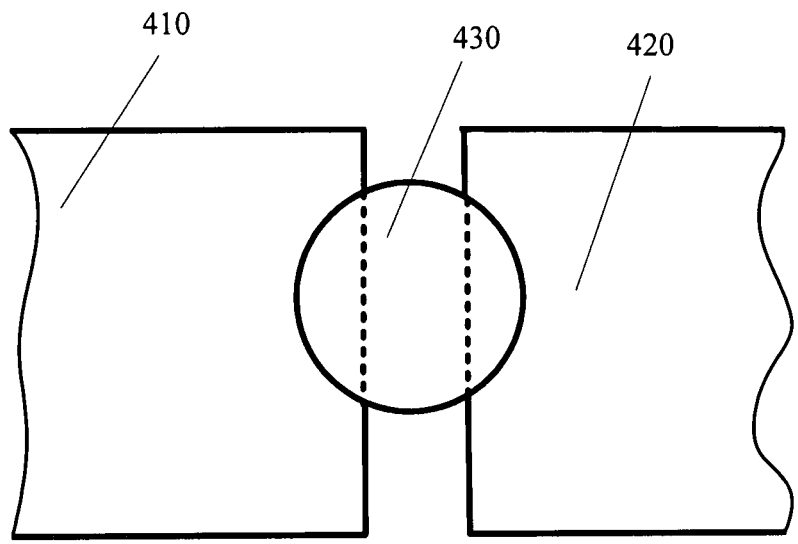
FIG. 5*a* is a plan view of a bonded structure according to a first embodiment of the present invention.
Figure 5B:
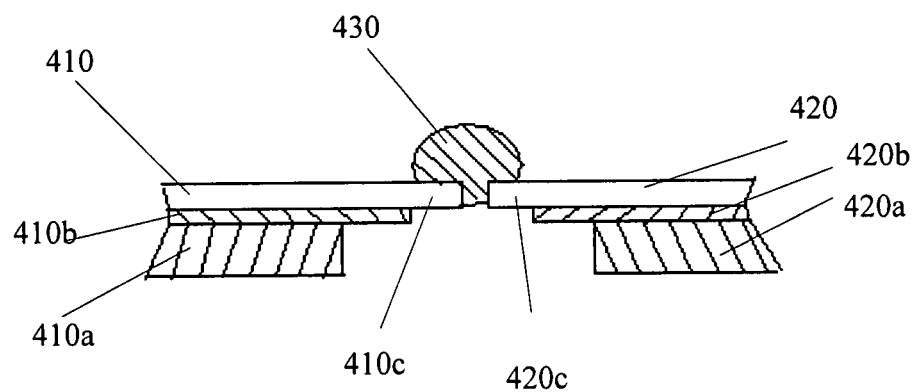
FIG. 5*b* is a cross-section view of the bonded structure shown in FIG. 5*a*.

FIGS. 5*a*-5*b* illustrate the principle of a bonded structure 400 for two electrical components according to a first embodiment of the present invention. The bonded structure 400 comprises a first electrical pad 410 disposed on one electrical component, a second electrical pad 420 disposed on the other electrical component and metal ball 430 for bonding or welding the first electrical pad 410 and the second electrical pad 420. It is appreciated that the metal ball 430 could be solder ball or gold ball. The two electrical components respectively have a first substrate layer 410*a*/420*a* and a second substrate layer 410b/420b laminated on the first substrate layer 410a/120a. The second substrate layer 410b/420b might be formed of polymer material. The first electrical pad 410 and the second electrical pad 410 each have an attaching surface attached to the second substrate layers 410b/420b of the respective electrical components, a bonding surface opposite the attaching surface. Both the bonding surfaces of the first electrical pad 410 and the second electrical pad 420 face the same direction. In addition, the first electrical pad 410 and the second electrical pad 420 each have an extended portion 410c/420c respectively extending beyond an edge of the second substrate layer 410b/420b and the first substrate layer 410a/420a. The metal ball 430 is disposed on the bonding surfaces of the extended portion 410c/420c of the first electrical pad 410 and the second electrical pad 420 to form a metal junction and thereby bond the first electrical pad 410 and the second electrical pad 420. The extended portions 410c/420c of the first electrical pad 410 and the second electrical pad 420 are on the same level and aligned with each other. Preferably, the first electrical pad 410 and the second electrical pad 420 are complementary shaped with each other. As in FIG. 5, both the first electrical pad 410 and the second electrical pad 420 are square in shape.

Figure 6:
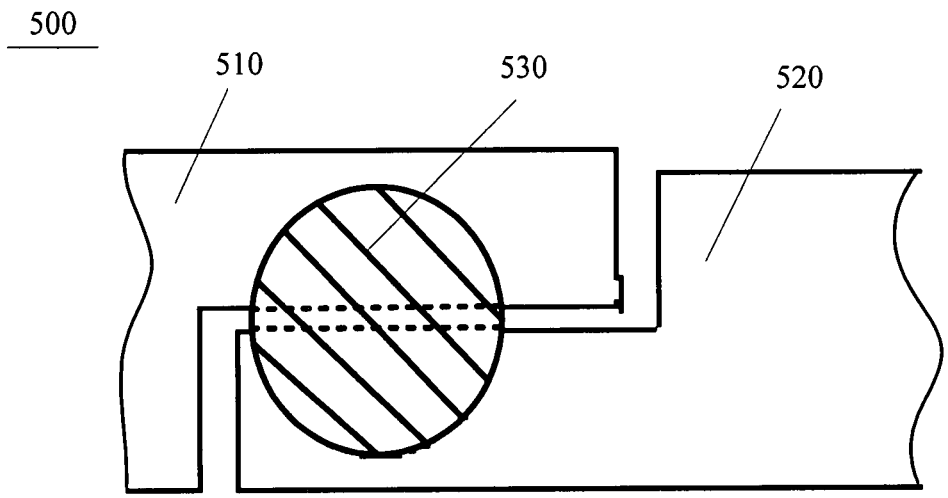
FIG. 6 is a plan view of a bonded structure according to a second embodiment of the present invention.

FIG. 6 illustrates the principle of a bonded structure 500 according to a second embodiment of the present invention. The bonded structure 500 comprises a first electrical pad 510, a second electrical pad 520 and a metal ball 530. The bonded structure 500 in the subject embodiment is similar to the bonded structure 400 mentioned above except that the first electrical pad 510 is L-shaped and the second electrical pad 520 is also L-shaped. The first electrical pad 510 and the second electrical pad 520 are complementarily aligned with each other on the same level.

Figure 7:
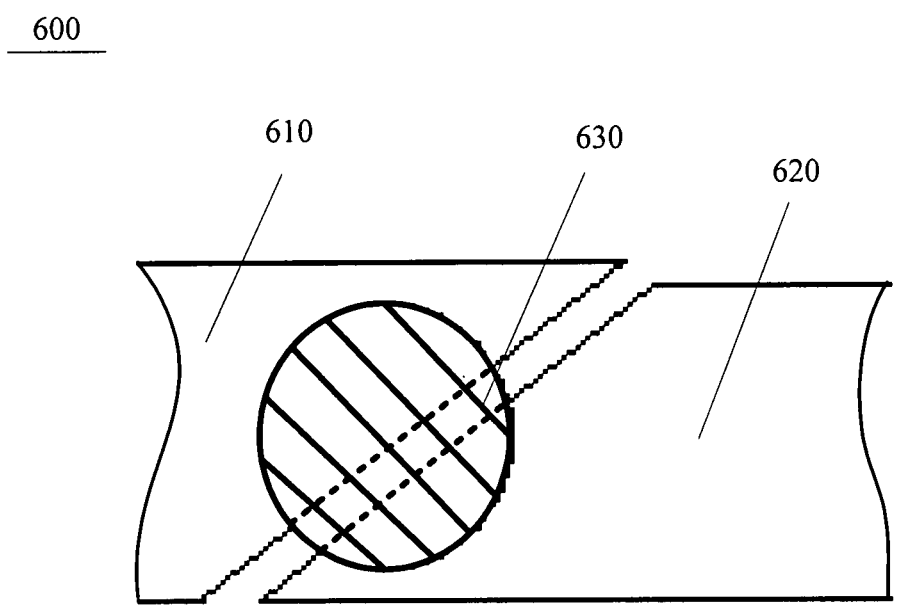
FIG. 7 is a plan view of a bonded structure according to a third embodiment of the present invention.

FIG. 7 illustrates the principle of a bonded structure 600 according to a third embodiment of the present invention. The bonded structure 600 comprises a first electrical pad 610, a second electrical pad 620 and a metal ball 630. The bonded structure 600 in the subject embodiment is similar to the bonded structure 400 mentioned above except that the first electrical pad 610 is trapezoidal in shape and the second electrical pad 620 is also trapezoidal in shape. The first electrical pad 610 and the second electrical pad 620 are complementarily aligned with each other on the same level.

Figure 8A:
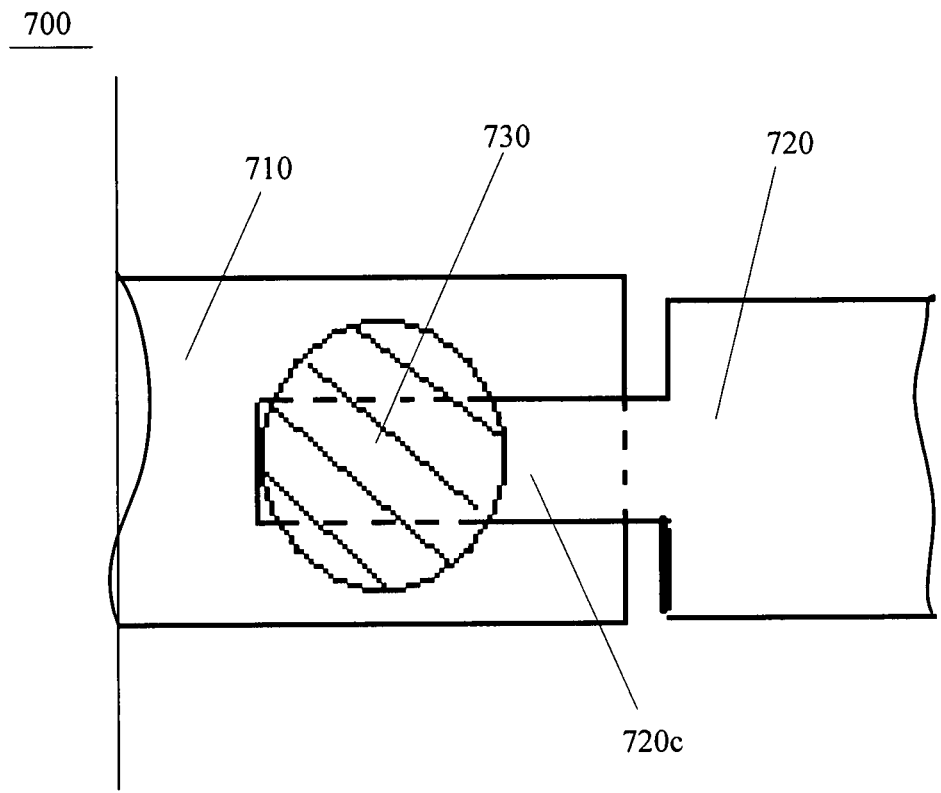
FIG. 8*a* is a plan view of a bonded structure according to a fourth embodiment of the present invention.
Figure 8B:
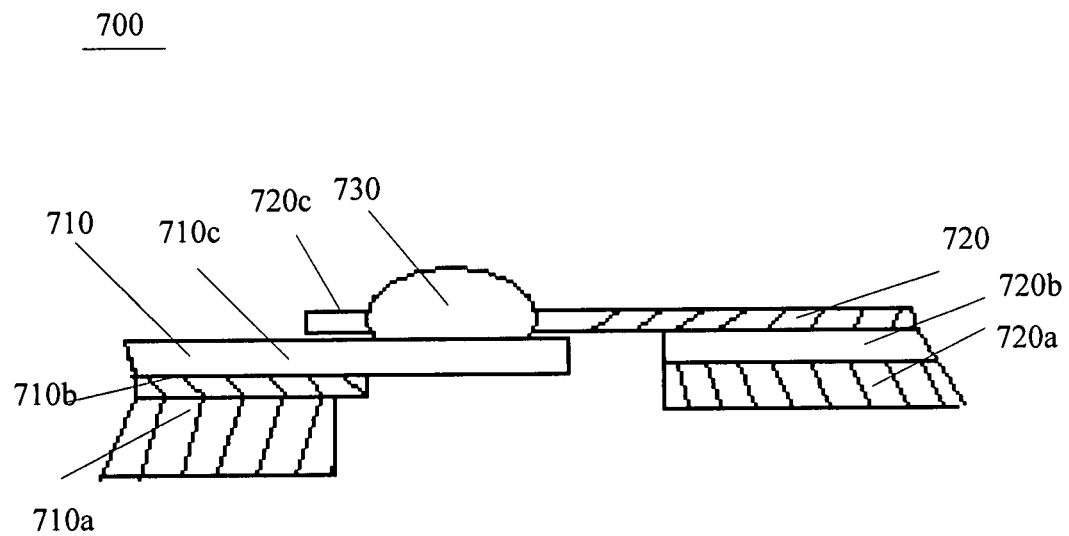
FIG. 8*b* is a cross-sectional view of the bonded structure shown in FIG. 8*a*.

FIGS. 8a-8b illustrate the principle of a bonded structure 700 of two components according to a fourth embodiment of the present invention. The bonded structure 700 comprises a first electrical pad 710 disposed on one electrical component, a second electrical pad 720 disposed on the other electrical component and metal ball 730 for bonding or welding the first electrical pad 710 and the second electrical pad 720. The configuration of the two electrical components and the first electrical pad 710 and the second electrical pad 720 are the same as those of bonded structure 400 in the first embodiment. Specifically, the two electrical components respectively have a first substrate layer 710a/720a and a second substrate layer 710b/720b which are constructed of the same features as the first substrate layer 410a/420a and the second substrate layer 410b/420b of bonded structure 400. The first electrical pad 710 and the second electrical pad 720 each have an attaching surface, a bonding surface and an extended portion 710c/720c which are constructed of the same features as the attaching surface, the bonding surface and the extended portion 410c/420c of bonded structure 400. Compared with the bonded structure 400, the difference is that the extended portion 720c of the second electrical pad 720 is laminated on the extended portion 710c of the first electrical pad 710. In addition, the extended portion 720c of the second electrical pad 720 has a width narrower than the extended portion 710c of the first electrical pad 710 to enable the metal ball 730 to contact the first electrical pad 710. As in FIG. 8a, the second electrical pad 720 has a narrow T-shaped portion which is laminated on the first electrical pad 710 thus enable the metal ball 730 to electrically connect with the first electrical pad 710. The metal ball 730 is disposed on the T-shaped portion of the second electrical pad 720 and electrically connects the first electrical pad 710 with the second electrical pad 720.

Figure 9:
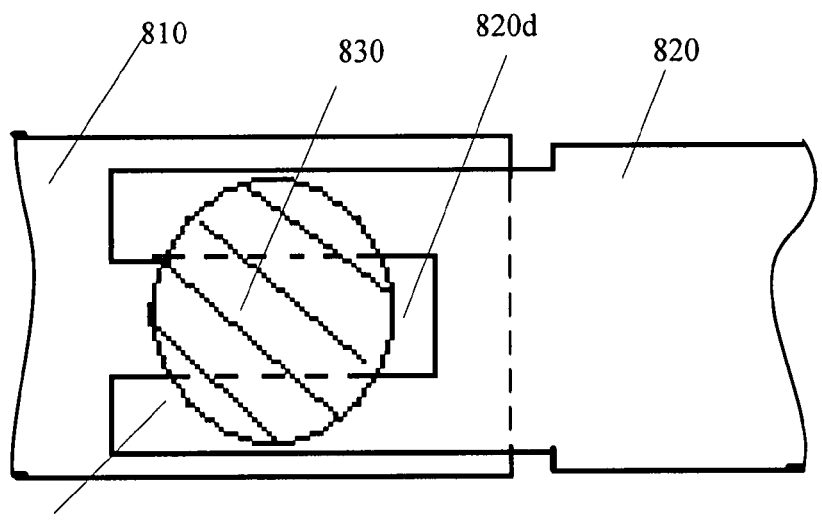
FIG. 9 is a plan view of a bonded structure according to a fifth embodiment of the present invention.

FIG. 9 illustrates the principle of a bonded structure 800 according to a fifth embodiment of the present invention. The bonded structure 800 comprises a first electrical pad 810, a second electrical pad 820 and a metal ball 830. The bonded structure 800 in the subject embodiment is similar to the bonded structure 700 mentioned above except that extended portion 820c of the second electrical pad 820 has a portion hollowed out to enable the metal ball 830 to contact the first electrical pad 810. In this embodiment, the hollowed-out portion of the second electrical pad 820 is a U-shaped portion 820d. Specifically, the U-shaped portion 820d of the extended portion 820c of the second electrical pad 820 is narrower than the first electrical pad 810 and is placed to laminate on the first electrical pad 810 for the metal ball 830 to establish electrical connection therebetween. The metal ball 830 is accommodated in the U-shaped portion 820d of the second electrical pad 820 and electrically connects the first electrical pad 810 with the second electrical pad 820.

Figure 10:
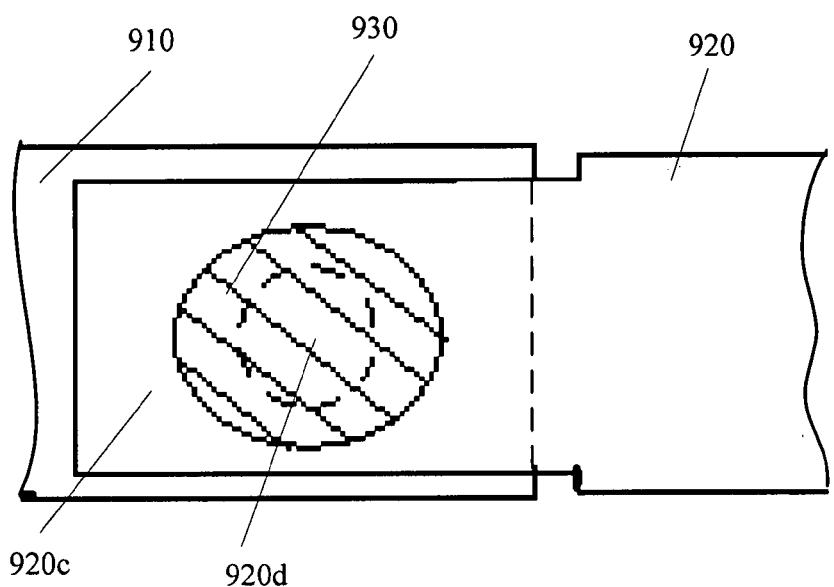
FIG. 10 is a plan view of a bonded structure according to a six embodiment of the present invention.

FIG. 10 illustrates the principle of a bonded structure 900 according to a sixth embodiment of the present invention. The bonded structure 900 comprises a first electrical pad 910, a second electrical pad 920 and a metal ball 930. The bonded structure 900 in the subject embodiment is similar to the bonded structure 800 mentioned above except that the hollowed-out portion of extended portion 920c of the second electrical pad 920 is a cylindrical portion 920d. The cylindrical portion 920d of the second electrical pad 920 is narrower than the first electrical pad 910 and is laminated on the first electrical pad 910 for the metal ball 930 to establish electrical connection therebetween. The metal ball 930 is accommodated in the cylindrical portion 920d of the second electrical pad 920 and electrically connects the first electrical pad 910 with the second electrical pad 920.

FIG. 11 illustrates the principle of a bonding method for electrical components according to the present invention. The electrical components respectively have a first substrate layer and a second substrate layer laminated on the first substrate layer. The bonding method comprises the steps of: (1) step etching the first substrate layer and the second substrate layer of one of the electrical components along an edge thereof, providing a first electrical pad with a first attaching surface and a first bonding surface opposite the first attaching surface, disposing the first electrical pad on the electrical component with the first attaching surface attached to the second substrate layer and the first electrical pad extended beyond the edge of the second substrate layer and the first substrate layer to form an extended portion (step S1); (2) step etching the first substrate layer and the second substrate layer of the other electrical component along an edge thereof, providing a second electrical pad with a second attaching surface and a second bonding surface opposite the second attaching surface, disposing the second electrical pad on the other electrical component with the second attaching surface attached to the second substrate layer and the second electrical pad extended beyond the edge of the second substrate layer and the first substrate layer to form an extended portion (step S2); (3) making the first and the second bonding surfaces of the first and the second electrical pads face the same direction (step S3); (4) disposing a metal ball on the extended portions of the first and the second bonding surfaces and forming a metal junction to bond the first and the second electrical pads (step S4).

Preferably, the step S3 further comprises a step of placing the first and the second electrical pads on the same level and aligning the first electrical pad with the second electrical pad.

Also the extended portion of the second electrical pad might have a width narrower than the extended portion of the first electrical pad, and the step S3 further comprises a step of laminating the extended portion of the second electrical pad on the extended portion of the first electrical pad.

Alternatively, the extended portion of the second electrical pad has a portion hollowed out, and the step S3 further comprises a step of laminating the extended portion of the second electrical pad on the extended portion of the first electrical pad.

Figure 12:
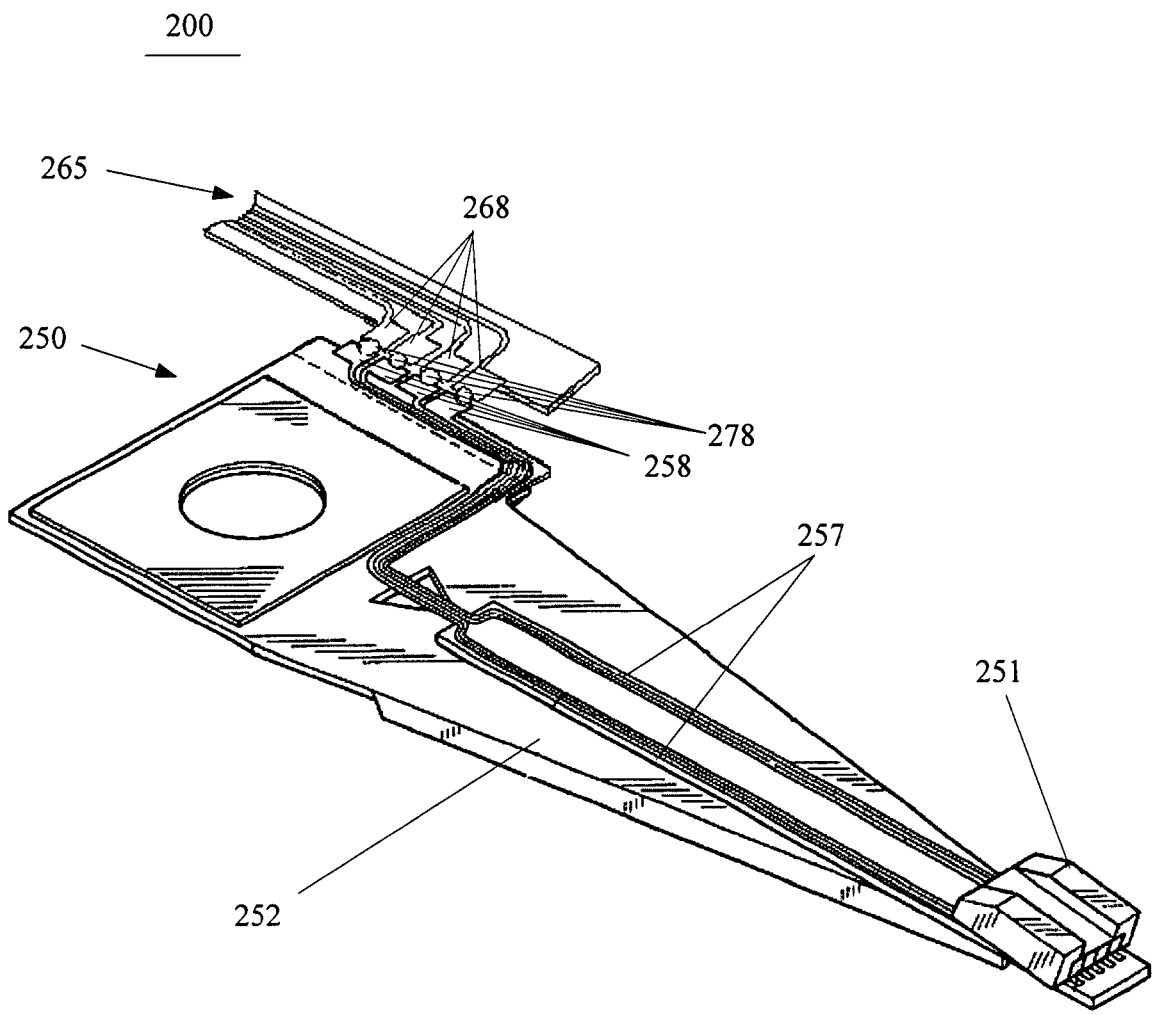
FIG. 12 is a perspective view of a head stack assembly according to present invention, showing a head gimbal assembly bonded to a flexible printed circuit.

FIG. 12 illustrates a head stack assembly 200 according to the present invention. The head stack assembly 200 comprises a head gimbal assembly 250, a flexible printed circuit 265 for controlling the operation of the head gimbal assembly 250 and metal ball 278 for electrically coupling the head gimbal assembly 250 with the flexible circuit 265. It is appreciated that the metal ball 278 could be solder ball or gold ball. In the embodiment, the head gimbal assembly 250 further comprises a slider 251 and a suspension 252 to load or support the slider 251. The slider 251 of the head gimbal assembly 250 is mounted on a tongue of the suspension 252 and is electrically connected with a printed circuit board assembly of a control system of a hard disk drive for electrically controlling the operation of the slider 251 via the flexible printed circuit 265. That is, the flexible printed circuit 265 is electrically connected with the head gimbal assembly 250 beforehand. The following details pertain primarily to the principles of electrical connection therebetween.

Figure 13:
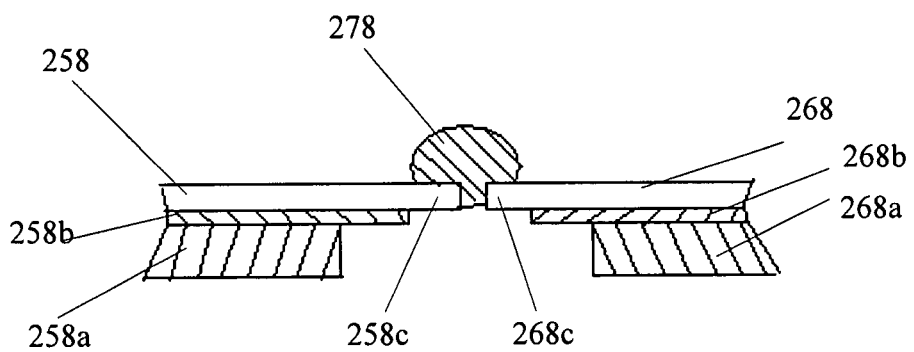
FIG. 13 is a cross-sectional view of a bonded fashion existing between the head gimbal assembly and the flexible printed circuit shown in FIG. 12.

Referring to FIGS. 12-13, the head gimbal assembly 250 and the flexible printed circuit 265 respectively have a first substrate layer 258a/268a such as stainless steel and a second substrate layer 258b/268b laminated on the first substrate layer 258a/268a. The second substrate layer 258b/268b is formed of polymer material. In addition, the head gimbal assembly 250 forms a plurality of first terminal pads 258 each having a first attaching surface attached to the second substrate layer 258b of the head gimbal assembly 250 and a first bonding surface opposite the first attaching surface. Similarly, the flexible printed circuit 265 forms a plurality of second terminal pads 268 each having a second attaching surface attached to the second substrate layer 268b of the flexible printed circuit 265 and a second bonding surface opposite the second attaching surface. The first and the second terminal pads 258/268 each have an extended portion 258c/268c extending beyond an edge of corresponding second substrate layer 258b/268b and first substrate layer 258a/268a. In the subject embodiment, the head gimbal assembly 250 and the flexible printed circuit 265 are arranged that the first and the second bonding surfaces face the same direction. The metal ball 278 is disposed on the first bonding surfaces of the extended portions 258c of the first terminal pads 258 of the head gimbal assembly 250 and the corresponding second bonding surfaces of the extended portions 268c of the second terminal pads 268 of the flexible printed circuit 265 so as to form metal junctions and thereby bond the first and the second terminal pads 258/268. In that way, the flexible printed circuit 265 is electrically connected with the head gimbal assembly 250 via second terminal pads 268 and first terminal pads 258.

In the subject invention, the extended portions 258c/268c of the first and the second terminal pads 258/268 are on the same level and aligned with each other. Alternatively, the extended portions 268c of the second terminal pads 268 are laminated on the extended portions 258c of the first terminal pads 258. It is understood that the extended portion 268c of the second terminal pads 268 each has a width narrower than the extended portion 258c of the first terminal pad 258 to enable the metal ball 278 to contact the first terminal pads 258. It is also understood that, alternatively, the extended portion 268c of the second terminal pads 268 has a portion hollowed out to enable the metal ball 278 to contact the first terminal pads 258.

In the embodiment, the suspension 252 also provides a plurality of outer suspension traces 257 formed on the suspension 252. One end of the suspension traces 257 is electrically connected with the slider 251 and the other end of the suspension traces 257 is electrically connected with the first terminal pads 258 of the head gimbal assembly 250 which establishes adequate electrical contact with the second terminal pads 268 of the flexible printed circuit 265. Thus the control signal conducted from the printed circuit board assembly of the control system can finely transmitted to the slider 251 through flexible printed circuit 265 and suspension traces 257, which further assists a good operation characteristics of the slider 251 of the head gimbal assembly 250.

Figure 14:
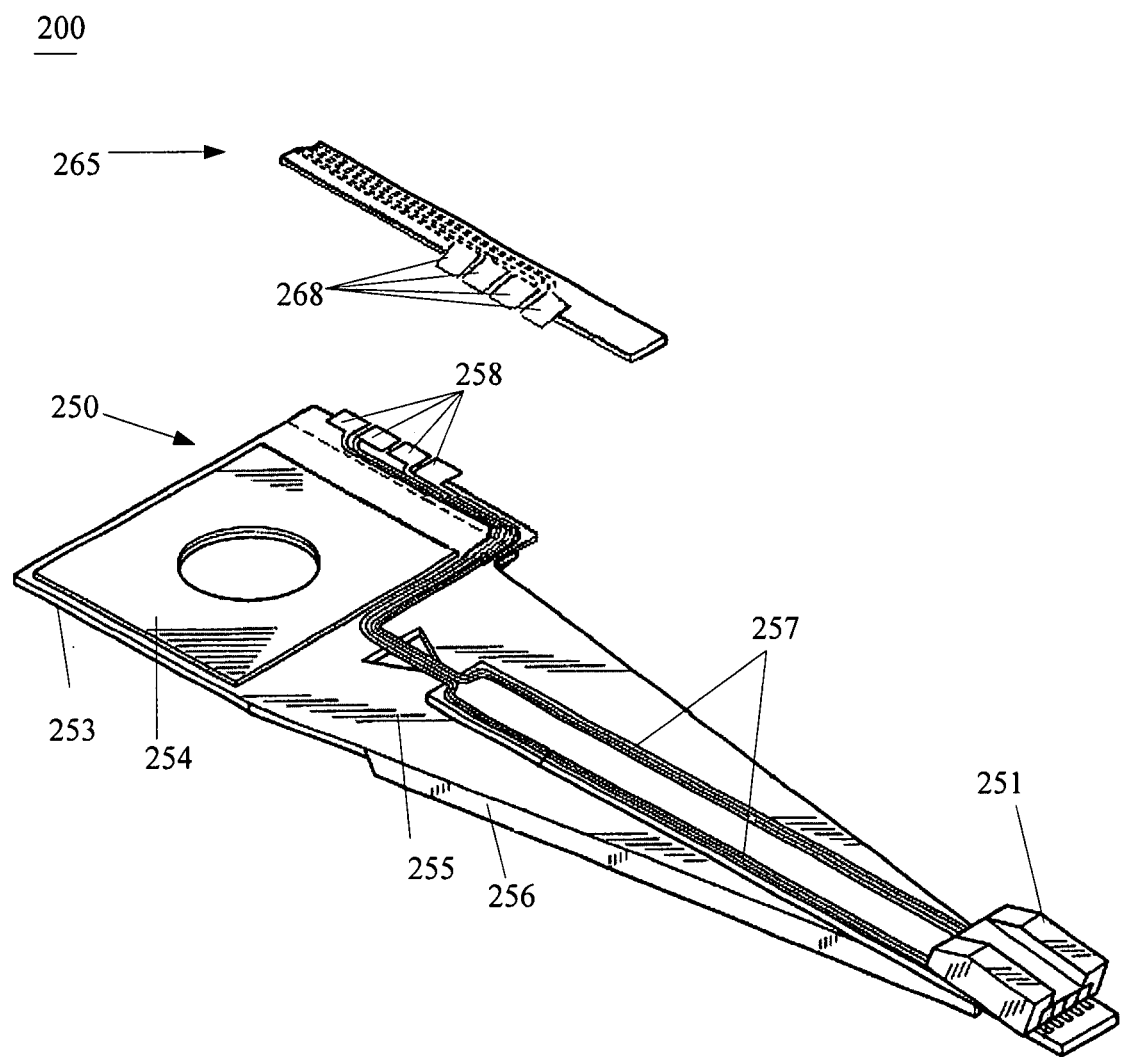
FIGS. 14-15 show how to bonding the head gimbal assembly and the flexible printed circuit shown in FIG. 12.
Figure 15:
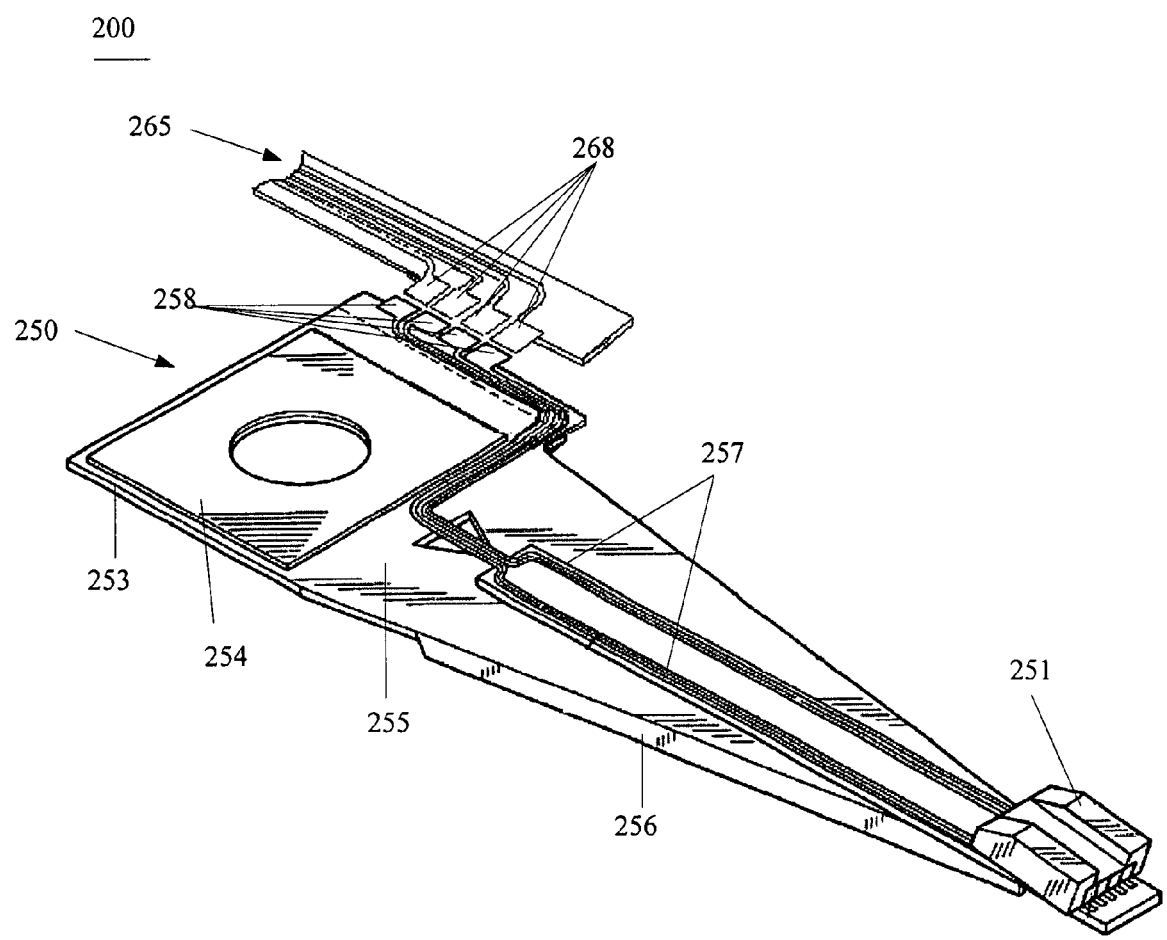

FIGS. 13-14 show how to assemble the head gimbal assembly 250 with the flexible printed circuit 265 of the head stack assembly 200 according to the present invention. That is first to making the first bonding surfaces of the first terminal pads 258 of the head gimbal assembly 250 and the corresponding second bonding surface of the second terminal pads 268 of the flexible printed circuit 265 face the same direction, and then apply metal ball 278 (such as solder ball or gold ball) to connect corresponding the first and the second terminal pads 258/268.

Figure 16:
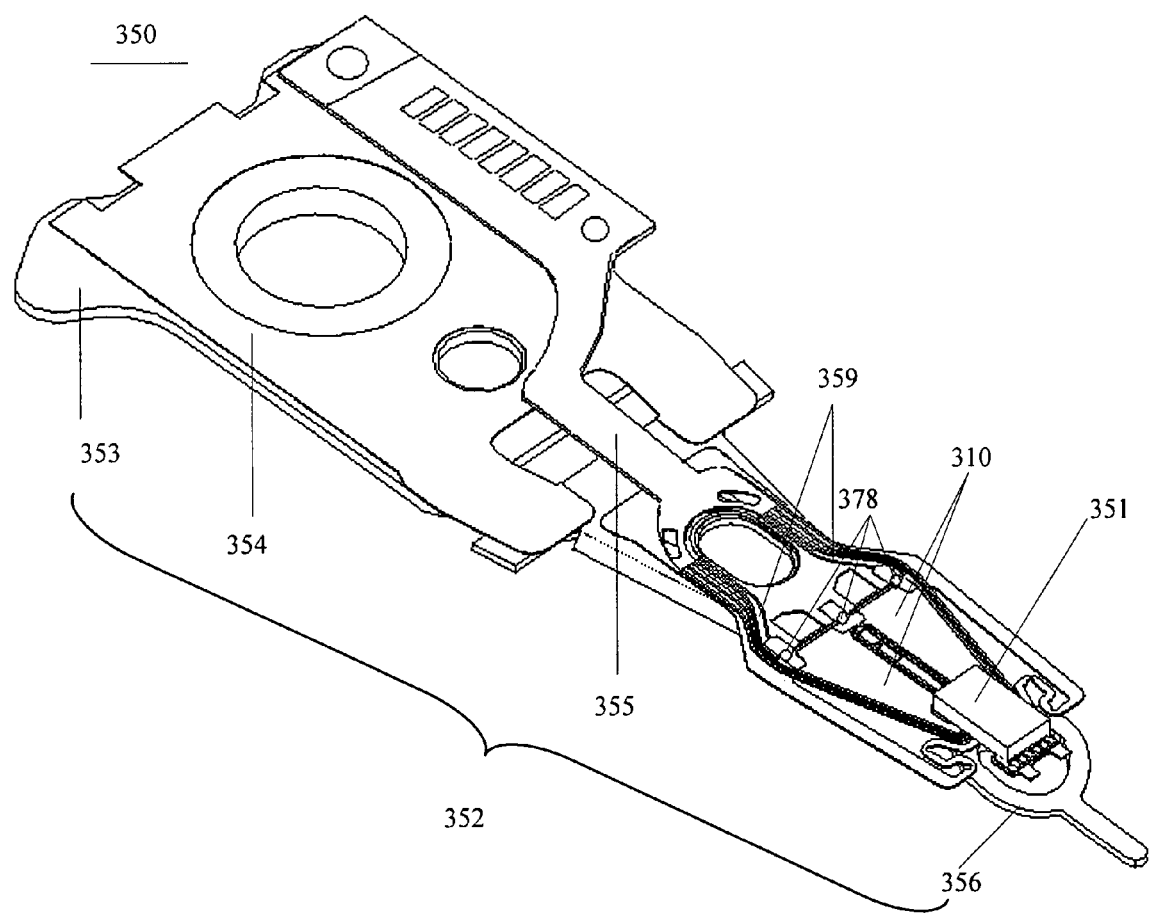
FIG. 16 is a perspective view of a head gimbal assembly according to the present invention, showing a micro-actuator bonded to a suspension.
Figure 17A:
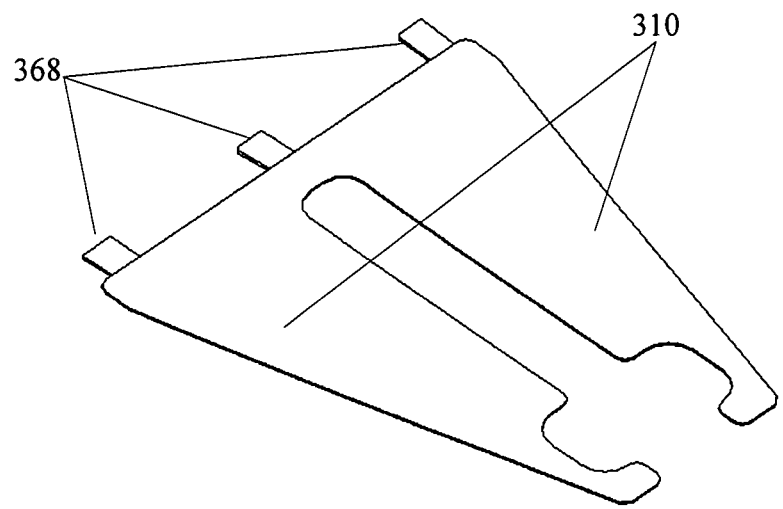
FIG. 17*a* illustrates detail structure of the tongue region of the suspension of FIG. 16.
Figure 17B:
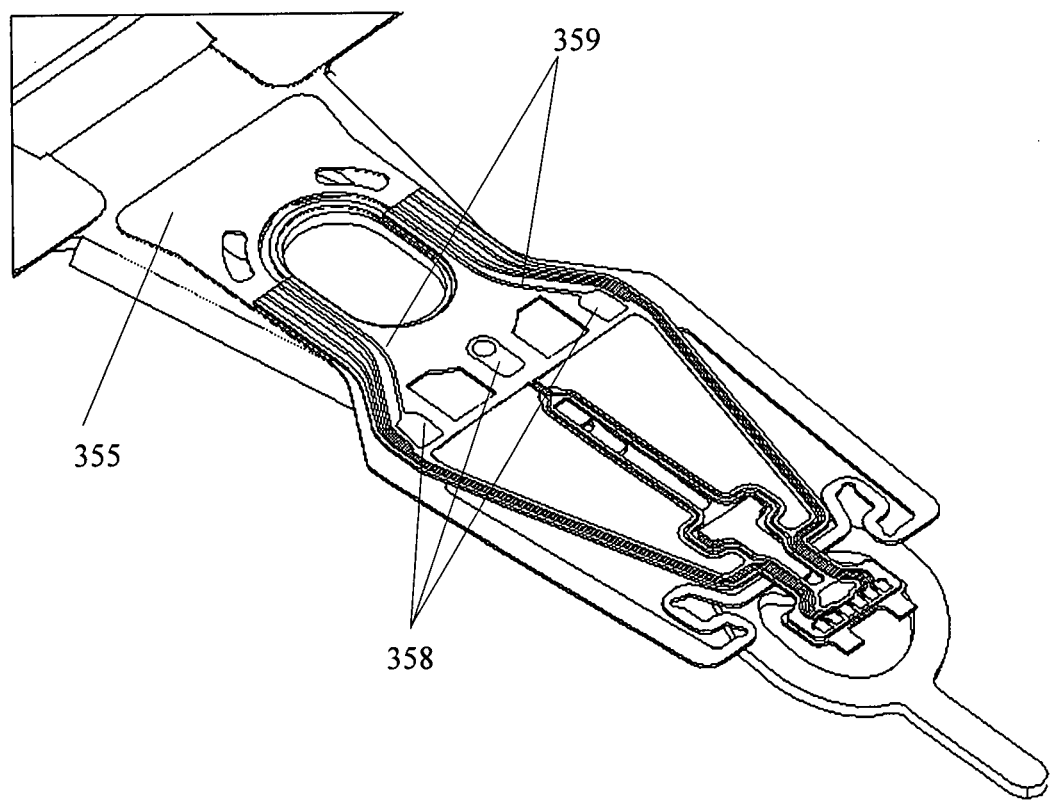
FIG. 17*b* illustrates detail structure of the micro-actuator of FIG. 16.

FIG. 16 illustrates a head gimbal assembly 350 according to present invention. The head gimbal assembly 350 includes a slider 351, a micro-actuator 310 having two PZT elements, a suspension 352 to load or support the slider 351 and the micro-actuator 310 and metal ball 378 for electrically connect the micro-actuator 310 with the suspension 352. In the embodiment, the micro-actuator 310 is provided to enable faster and finer positional control for the slider 351, as well as to reduce the seeking and settling time during operation. In the subject embodiment, the metal ball 378 could be solder ball or gold ball.

The suspension 352 includes a load beam 356, a base plate 353, a hinge 354 and a flexure 355, all of which are assembled together. The load beam 356 is connected to the base plate 353 by the hinge 354, and the flexure 355 runs from the hinge 354 to the load beam 356. One end of the load beam 356 is coupled to the base plate 353 which is swaged to the drive arm (not shown), and the other end of the load beam 356 supports the tongue region of the flexure 355. The tongue region of the flexure 355 provides flexibility for the slider 351. The slider 351 and the micro-actuator 310 is positioned at a tongue region of the suspension 352.

The micro-actuator 310 is electrically connected with the suspension 352 of the head gimbal assembly 350 in order to electrically couple to an external control system for transmitting signals to control the position of the slider 310. The following details pertain primarily to the principles of electrical connection between the micro-actuator 310 and the suspension 352.

Figure 18:
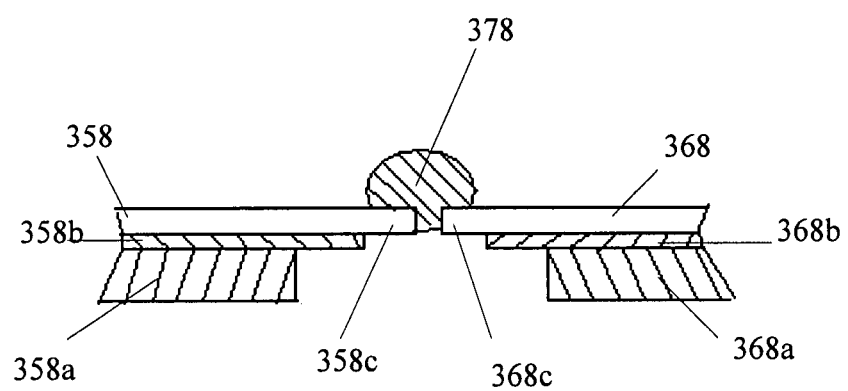
FIG. 18 is a cross-sectional view of a bonded fashion existing between the micro-actuator and the suspension shown in FIG. 16.

Referring to FIG. 18, the micro-actuator 310 and the suspension 352 respectively have a first substrate layer 368a/358a and a second substrate layer 368b/358b laminated on the first substrate layer 368a/358a. The micro-actuator 310 has a plurality of micro-actuator pads 368 having a first attaching surface attached to the second substrate layer 368b of micro-actuator 310 and a first bonding surface opposite the first attaching surface. The suspension 352 has a plurality of suspension pads 358 having a second attaching surface attached to the second substrate layers 358b of the suspension 352 and a second bonding surface opposite the second attaching surface. The micro-actuator pads 368 and the suspension pads 358 each have an extended portion extending 368c/358c beyond an edge of corresponding second substrate layer 368b/358b and first substrate layer 368a/358a. The micro-actuator 310 and the suspension 352 are arranged that the first bonding surface and the second bonding surfaces face the same direction. The metal ball 378 is disposed on the first bonding surfaces of the extended portions 368c of the micro-actuator pads 368 and the second bonding surfaces of the extending portions 358c of the respective suspension pads 358 to form metal junctions and thereby bond the micro-actuator pads 368 and the suspension pads 358. In this embodiment, forming a metal junction is carried out in such a way as metal welding such as ultrasonic welding.

In the subject embodiment, the extended portion 368c/358c of the micro-actuator pads 368 and the suspension pads 358 are on the same level and aligned with each other. Alternatively, the extended portion 368c of the micro-actuator pads 368 is laminated on the extended portion 358c of the suspension pads 358. It is understood that the extended portion 368c of the micro-actuator pads 368 has a width narrower than the extended portion 358c of the suspension pads 358 to enable the metal ball 378 to contact the suspension pads 358. It is also understood that, alternatively, the extended portion 368c of the micro-actuator pads 368 has a portion hollowed out to enable the metal ball 378 to contact the suspension pads 358.

In the embodiment, the suspension 352 also provides a plurality of inner suspension traces 359. One end of the inner suspension traces 359 are electrically connected with the external control system, the other end of the inner suspension traces 359 are electrically connected with the suspension pads 358 of the suspension 352 which establish adequate electrical contact with the micro-actuator pads 368 of the micro-actuator 310. Thus the control signal conducted from the external control system can finely transmitted to the micro-actuator 310 through inner suspension traces 359, suspension pads 358 and micro-actuator pads 368. When in operation, the PZT elements of the micro-actuator 310 will be excited to selectively cause expansion or contraction according to the control signal, which accordingly causes movement of the slider 351, thus successfully fine tuning the position of the slider 351.

Figure 19:
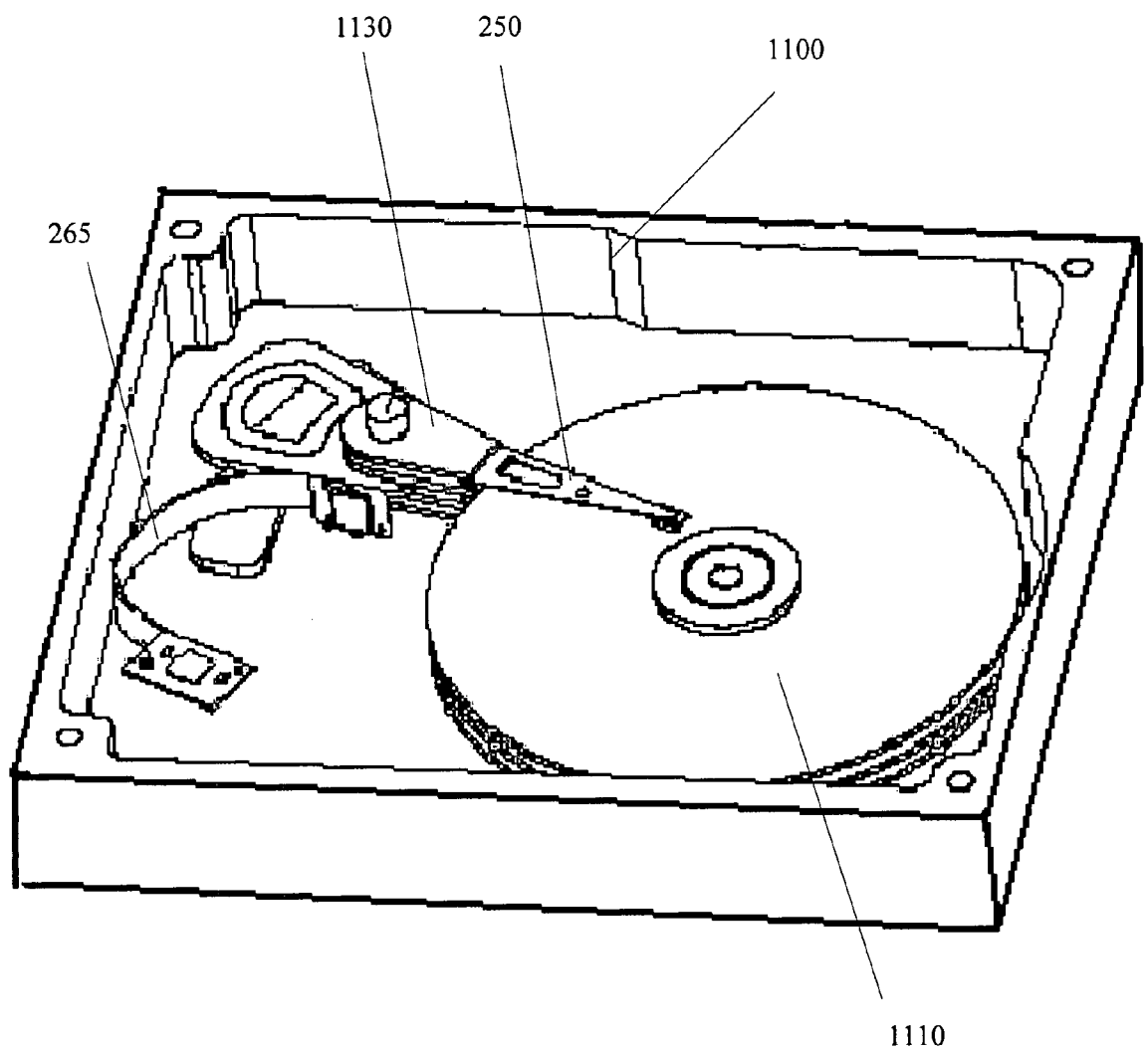
FIG. 19 is a perspective view of a disk drive unit according to the present invention.

FIG. 19 illustrates a disk drive unit of the present invention. The disk drive unit comprises a base 1100, a disk 1110, a spindle motor for spinning the disk 1110, the head gimbal assembly 250 of the present invention, a drive arm 1130 to connect the head gimbal assembly 250, the flexible printing circuit 265 of the present invention for controlling the operation of the head gimbal assembly 250 and metal ball (not shown) for establishing electrical connection between the flexible printing circuit 265 and the head gimbal assembly 250. The way of the flexible printed circuit 265 electrically connected to the head gimbal assembly 250 is fashioned as the same way as mentioned above. According to the principle of the present invention, the head gimbal assembly 250 could also be featured as the head gimbal assembly 350 which employs the micro-actuator 310 for fine tuning the operation of the slider 351 of the head gimbal assembly 350. The way of the micro-actuator 310 electrically connected to the suspension 352 of the head gimbal assembly 350 is fashioned as the same way as mentioned above. Because the structure and/or assembly process of the disk drive unit of the present invention are well known to persons ordinarily skilled in the art, a detailed description of such structure and assembly is omitted herefrom.

The foregoing description of the present invention has been presented for purposes of illustration and description. It is not intended to be exhaustive or limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A bonded structure for electrical components comprising:
    a first electrical pad disposed on one of the electrical components;
    a second electrical pad disposed on the other electrical component; and
    metal ball for bonding or welding the first and the second electrical pads;
    wherein the first and the second electrical pads each have an attaching surface attached to the corresponding electrical component and a bonding surface opposite the attaching surface;
    wherein both the bonding surfaces of the first and the second electrical pads face the same direction, and the metal ball is disposed on both the bonding surfaces to form a metal junction and thereby bond the first and the second electrical pads,
    wherein the electrical components respectively have a first substrate layer and a second substrate layer laminated on the first substrate layer, the first and the second electrical pads are disposed on the second substrate layers of the respective electrical components and each have an extended portion extending beyond an edge of the second substrate layer and the first substrate layer, and the metal ball is disposed on the extended portions of the first and the second electrical pads, and
    wherein the extended portions of the first and the second electrical pads are on the same level and aligned with each other.

2. The bonded structure according to claim 1, wherein the extended portion of the second electrical pad is laminated on the extended portion of the first electrical pad.

3. The bonded structure according to claim 2, wherein the extended portion of the second electrical pad has a width narrower than the extended portion of the first electrical pad to enable the metal ball to contact the first electrical pad.

4. The bonded structure according to claim 2, wherein the extended portion of the second electrical pad has a portion hollowed out to enable the metal ball to contact the first electrical pad.

5. The bonded structure according to claim 1, wherein the metal ball is solder ball or gold ball.

6. A bonding method for electrical components, comprising:
    (1) disposing a first electrical pad on one of the electrical components, the first electrical pad having a first attaching surface attached to the electrical component and a first bonding surface opposite the first attaching surface;
    (2) disposing a second electrical pad on the other electrical component, the second electrical pad having a second attaching surface attached to the other electrical component and a second bonding surface opposite the second attaching surface;

(3) making the first and the second bonding surfaces of the first and the second electrical pads face the same direction; and (4) disposing a metal ball on the first and the second bonding surfaces and forming a metal junction to bond the first and the second electrical pads, wherein the electrical components respectively have a first substrate layer and a second substrate layer laminated on the first substrate layer, wherein (1) further comprises step etching the first substrate layer and the second substrate layer of the electrical component along an edge thereof so that the first electrical pad extends beyond the edge of the second substrate layer and the first substrate layer to form an extended portion, wherein (2) further comprises step etching the first substrate layer and the second substrate layer of the other electrical component along an edge thereof so that the second electrical pad extends beyond the edge of the second substrate layer and the first substrate layer to form an extended portion, wherein (3) further comprises placing the first and the second electrical pads on the same level and aligning the first electrical pad with the second electrical pad, and wherein the metal ball is disposed on the extended portions in (4).

7. The bonding method according to claim 6, wherein the extended portion of the second electrical pad has a width narrower than the extended portion of the first electrical pad, and (3) further comprises:

laminating the extended portion of the second electrical pad on the extended portion of the first electrical pad.

8. The bonding method according to claim 6, wherein the extended portion of the second electrical pad has a portion hollowed out, and (3) further comprises:

laminating the extended portion of the second electrical pad on the extended portion of the first electrical pad.

9. A head gimbal assembly comprising:

a micro-actuator;

at least one micro-actuator pad disposed on the micro-actuator, the micro-actuator pad having a first attaching surface attached to the micro-actuator and a first bonding surface opposite the first attaching surface;

a suspension to load the micro-actuator;

at least one suspension pad disposed on the suspension, the suspension pad having a second attaching surface attached to the suspension and a second bonding surface opposite the second attaching surface; and metal ball for bonding or welding the micro-actuator pad and the corresponding suspension pad;

wherein the micro-actuator and the suspension are arranged that the first and the second bonding surfaces face the same direction, and the metal ball is disposed on the first and the second bonding surfaces to form a metal junction and thereby bond the micro-actuator pad and the suspension pad, wherein the micro-actuator and the suspension respectively have a first substrate layer and a second substrate layer laminated on the first substrate layer, the micro-actuator pad is disposed on the second substrate layer of the micro-actuator while the suspension pad is disposed on the second substrate layer of the suspension, the micro-actuator pad and the suspension pad each have an extended portion extending beyond an edge of the corresponding second substrate layer and the corresponding first substrate layer, and the metal ball is disposed on the extended portions of the micro-actuator pad and the suspension pad, and wherein the extended portions of the micro-actuator pad and the suspension pad are on the same level and aligned with each other.

10. The head gimbal assembly according to claim 9, wherein the extended portion of the micro-actuator pad is laminated on the extended portion of the suspension pad.

11. The head gimbal assembly according to claim 10, wherein the extended portion of the micro-actuator pad has a width narrower than the extended portion of the suspension pad to enable the metal ball to contact the suspension pad.

12. The had gimbal assembly according to claim 10, wherein the extended portion of the micro-actuator pad has a portion hollowed out to enable the metal ball to contact the suspension pad.

13. A head stack assembly comprising:

a head gimbal assembly;

at least one first terminal pad disposed on the head gimbal assembly, the first terminal pad having a first attaching surface attached to the head gimbal assembly and a first bonding surface opposite the first attaching surface;

a flexible printed circuit for controlling the head gimbal assembly;

at least one second terminal pad disposed on the flexible printed circuit, the second terminal pad having a second attaching surface attached to the flexible printed circuit and a second bonding surface opposite the second attaching surface; and metal ball for bonding or welding the first terminal pad and the second terminal pad;

wherein the head gimbal assembly and the flexible printed circuit are arranged that the first and the second bonding surfaces face the same direction, and the metal ball is disposed on the first and the second bonding surfaces to form a metal junction and thereby bond the first terminal pad and the second terminal pad, wherein the head gimbal assembly and the flexible printed circuit respectively have a first substrate layer and a second substrate layer laminated on the first substrate layer, the first terminal pad is disposed on the second substrate layer of the head gimbal assembly and the second terminal pad is disposed on the second substrate layer of the flexible printed circuit, the first terminal pad and the second terminal pad each have an extended portion extending beyond an edge of the corresponding second substrate layer and the corresponding first substrate layer, and the metal ball is disposed on the extended portions of the first terminal pad and the second terminal pad, and wherein the extended portions of the first terminal pad and the second terminal pad are on the same level and aligned with each other.

14. The head stack assembly according to claim 13, wherein the extended portion of the second terminal pad is laminated on the extended portion of the first terminal pad.

15. The head stack assembly according to claim 14, wherein the extended portion of the second terminal pad has a width narrower than the extended portion of the first terminal pad to enable the metal ball to contact the first terminal pad.

16. The head stack assembly according to claim 14, wherein the extended portion of the second terminal pad has a portion hollowed out to enable the metal ball to contact the first terminal pad.

17. A disk drive unit comprising:
a head gimbal assembly having at least one first terminal pad;
a drive arm to connect the head gimbal assembly;
a disk;
a spindle motor to spin the disk;
a flexible printed circuit for controlling the head gimbal assembly, the flexible printed circuit having at least one second terminal pad; and
metal ball for bonding or welding the first terminal pad and the second terminal pad;
wherein the first terminal pad has a first attaching surface attached to the head gimbal assembly and a first bonding surface opposite the first attaching surface, the second terminal pad has a second attaching surface attached to the flexible printed circuit and a second bonding surface opposite the second attaching surface;
wherein the head gimbal assembly and the flexible printed circuit are arranged that the first and the second bonding surfaces face the same direction, and the metal ball is disposed on the first and the second bonding surfaces to form a metal junction and thereby bond the first terminal pad and the second terminal pad,
wherein the head gimbal assembly and the flexible printed circuit respectively have a first substrate layer and a second substrate layer laminated on the first substrate layer, the first terminal pad is disposed on the second substrate layer of the head gimbal assembly and the second terminal pad is disposed on the second substrate layer of the flexible printed circuit, the first terminal pad and the second terminal pad each have an extended portion extending beyond an edge of the corresponding second substrate layer and the corresponding first substrate layer, and the metal ball is disposed on the extended portions of the first terminal pad and the second terminal pad, and
wherein the extended portions of the first terminal pad and the second terminal pad are on the same level and aligned with each other.

18. The disk drive unit according to claim 17, wherein the head gimbal assembly further comprises:
a micro-actuator;
at least one micro-actuator pad disposed on the micro-actuator, the micro-actuator pad having a first attaching surface attached to the micro-actuator and a first bonding surface opposite the first attaching surface thereof;
a suspension to load the micro-actuator;
at least one suspension pad disposed on the suspension, the suspension pad having a second attaching surface attached to the suspension and a second bonding surface opposite the second attaching surface thereof; and
metal ball for bonding or welding the micro-actuator pad and the corresponding suspension pad;
wherein the micro-actuator and the suspension are arranged that the first and the second bonding surfaces of the micro-actuator pad and the suspension pad face the same direction, and the metal ball is disposed on the first and the second bonding surfaces of the micro-actuator pad and the suspension pad to form a metal junction and thereby bond the micro-actuator pad and the suspension pad.

* * * * *